(12) United States Patent
Kuramoto

(10) Patent No.: US 8,957,372 B2
(45) Date of Patent: Feb. 17, 2015

(54) SCANNING ELECTRON MICROSCOPE

(71) Applicant: JEOL Ltd., Tokyo (JP)

(72) Inventor: Tatsuru Kuramoto, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/027,424

(22) Filed: Sep. 16, 2013

(65) Prior Publication Data
US 2014/0084158 A1    Mar. 27, 2014

(30) Foreign Application Priority Data

Sep. 21, 2012   (JP) .................................. 2012-208043

(51) Int. Cl.
*H01J 37/26*    (2006.01)
*H01J 37/04*    (2006.01)
*H01J 37/147*   (2006.01)

(52) U.S. Cl.
CPC ............... *H01J 37/265* (2013.01); *H01J 37/04* (2013.01); *H01J 37/1472* (2013.01)
USPC ........ 250/311; 250/310; 250/306; 250/396 R; 250/397

(58) Field of Classification Search
USPC ................. 250/305, 306, 307, 309, 310, 311, 250/396 R, 397
See application file for complete search history.

(56) References Cited

U.S. PATENT DOCUMENTS

| 5,759,423 A * | 6/1998 | Sohda et al. ..................... 216/45 |
| 7,425,701 B2 | 9/2008 | Steigerwald et al. |
| 2004/0031921 A1* | 2/2004 | Kondo et al. ................. 250/311 |
| 2012/0148959 A1* | 6/2012 | Choi et al. .................... 430/296 |

FOREIGN PATENT DOCUMENTS

JP    2008153158 A    7/2008

* cited by examiner

*Primary Examiner* — Nicole Ippolito
(74) *Attorney, Agent, or Firm* — The Webb Law Firm

(57) ABSTRACT

A scanning electron microscope has a first condenser lens (121) having a lens gap (121a) facing toward an electron source (50) and a second condenser lens (122) having a lens gap (122a) facing toward an objective lens (13). The first and second condenser lenses are disposed between the electron source (50) and the objective lens (13). First deflecting means (133) is disposed in a beam passage opening formed in the first condenser lens (121). Second deflecting means (136) is disposed in a beam passage opening formed in the second condenser lens (122). An aperture plate (113) having a plurality of apertures (113a) of different diameters is mounted between the first deflecting means (133) and the second deflecting means (136). An electron detector (102) having a beam passage aperture (102a) is mounted between the second deflecting means (136) and the objective lens (13).

7 Claims, 10 Drawing Sheets

SCANNING ELECTRON MICROSCOPE

BACKGROUND OF THE INVENTION

1. Field of the Invention

The present invention relates to a scanning electron microscope for obtaining a scanned image of a specimen by scanning an electron beam over the specimen.

2. Description of Related Art

The structure of a general scanning electron microscope is shown in FIGS. 1A and 1B. FIG. 1A shows the lens arrangement of the scanning electron microscope. FIG. 1B shows the orbit of an electron beam through the lens arrangement. In the electron beam orbit, the angle is exaggerated about 10 times for ease of understanding.

An electron gun 50 that is an electron source has an emitter 1, an extraction electrode 2, and acceleration electrodes 3. An extraction voltage is applied to the extraction electrode 2. As a result, electrons are extracted from the emitter 1 and accelerated by an acceleration voltage applied to the acceleration electrodes 3. Then, the electrons are released as an electron beam 1b toward a specimen 14.

A first condenser lens 11, a second condenser lens 101, and an objective lens 13 are arranged between the electron gun 50 and the specimen 14. The second condenser lens 101 may also be referred to as an angular aperture control lens.

An objective aperture plate 12 is disposed close to the specimen side of the first condenser lens 11. An electron detector 102 is disposed close to the specimen side of the second condenser lens 101. The objective aperture plate 12 and electron detector 102 are provided with apertures 12a and 102a, respectively, through which the electron beam passes. These apertures 12a and 102a are located on the optical axis 1a of the electron optical system.

The first condenser lens 11 acts to vary the current value (probe current value) of the electron beam impinging on the specimen 14. The second condenser lens 101 adjusts the orbit of the electron beam such that the electron optical system is optimized for the aberration in the objective lens 13. In FIG. 1B, the first condenser lens 11 is operated in a real imaging mode, while the second condenser lens 101 is operated in a virtual imaging mode as one example.

Where the probe current value of the electron beam is varied using such a lens system, the excitation of the first condenser lens 11 is varied (e.g., the excitation is weakened) or the selected aperture 12a of the objective aperture plate 12 is manually switched to another aperture of a different diameter. At this time, the state of excitation of the second condenser lens 101 is also varied so as to minimize the probe diameter of the electron beam over the specimen 14.

Another lens arrangement as shown in FIGS. 2A and 2B is also available. FIG. 2A shows the lens arrangement of the scanning electron microscope. FIG. 2B shows the orbit of the electron beam through the lens arrangement. In FIGS. 1A, 1B, 2A, and 2B, like components are indicated by like reference numerals.

In the structure shown in FIGS. 2A and 2B, an objective aperture plate 113 is provided with plural apertures 113a of different diameters. Deflectors 111 and 112 are disposed above and below, respectively, the objective aperture plate 113 to permit the selected aperture 113a of the objective aperture plate 113 through which the electron beam 1b passes is switched among the apertures in the objective aperture plate 113. In this case, the deflectors 111, 112 and objective aperture plate 113 are preferably disposed close to the electron gun 50.

In any example of the above-described lens arrangements, the electron detector 102 is disposed in a position located beside the optical axis 1a of the electron optical system. Therefore, electrons released from the specimen 14 by electron beam irradiation undergo the lens action of the electron optical system until the electrons are detected by the detector 102. Consequently, in designing the electron optical system, behavior of the electrons to be detected needs to be discussed at the same time.

Electron detectors disposed along the optical axis 1a of the electron optical system in this way are often used to detect elastically scattered electrons having small emission angles (about 5 to 30°) with respect to a reference angle (0°) that is the optical axis 1a of the electron optical system. Electrons released from the specimen 14 are affected to different extents by spherical aberration, depending on their different emission angles.

Spherical aberration more strongly focuses electrons having larger emission angles out of electrons emitted from the specimen 14. Therefore, elastically scattered electrons having smaller emission angles are less affected by spherical aberration and assume orbits similar to the orbit of the electron beam (primary electron beam) directed at the specimen 14. For this reason, in order to detect elastically scattered electrons having smaller emission angles, an electron detector needs to be disposed in a position where the primary electron beam is spread.

Accordingly, in the configuration of FIGS. 1A and 1B, the electron detector 102 can efficiently detect scattering electrons emitted at small angles by placing the detector closer to the objective lens 13. The same principle applies to the configuration of FIGS. 2A and 2B. Elastically scattered electrons emitted at smaller angles can be detected by reducing the diameter of the aperture 102a in the electron detector 102.

A well-known technique for detecting elastically scattered electrons is set forth, for example, in U.S. Pat. No. 7,425,701. Note that this well-known technique is a method of detecting and discriminating electrons having small energies from electrons having large energies and that there is no mention of detection of the angles of elastically scattered electrons.

JP-A-2008-153158 sets forth a method of sorting electrons to be detected by making use of an electron detector and the action of a lens disposed behind the detector.

In the example of FIGS. 1A and 1B, a mechanism for manually driving or adjusting the objective aperture plate 12 is necessary to switch the selected aperture 12a of the objective aperture plate 12 to other aperture of a different diameter. Furthermore, the operator of this instrument must adjust the axis of the aperture 12a manually whenever the objective aperture plate 12 is moved and the selected aperture 12a is switched.

In contrast, in the example of FIGS. 2A and 2B, switching of the selected aperture 113a of the objective aperture plate 113 through which the electron beam passes and adjustment of the axis are made by the deflecting action of the same deflection system. Therefore, this technique is free from cumbersome manual operations needed in the technique shown in FIGS. 1A and 1B.

However, the technique shown in FIGS. 2A and 2B has the problem that there are restrictions on the arrangement of the objective aperture plate 113 and deflectors 111, 112.

In particular, the objective aperture plate 113 is provided with plural apertures 113a. When the objective aperture plate 113 is placed remotely from the electron source, the electron beam reaching the objective aperture plate 113 is spread. As a result, a larger ratio of the electron beam passes through the nonelected ones of the apertures 113. Therefore, the objective aperture plate 113 and deflectors 111, 112 need to be placed as close as possible to the electron source.

In the configuration shown in FIGS. 2A and 2B, however, the first condenser lens 11 is located above the deflector 111 and so it is impossible to place the objective aperture plate 113 and deflectors 111, 112 closer to the electron source.

Furthermore, in the configuration shown in FIGS. 2A and 2B, the first condenser lens 11 cannot be operated in the real imaging mode. That is, in this configuration, if the first condenser lens 11 is strongly excited, interference occurs between the focusing field produced by the lens 11 and the deflecting field produced by the upper deflector 111. The focusing field gives a rotating action to the deflecting field. This makes it difficult to control the electron beam.

Consequently, the operation of the first condenser lens 11 is restricted to the virtual imaging mode. Thus, if the probe current of the electron beam is increased, the angular aperture of the objective lens 13 decreases. Since the angular aperture used to enhance the resolution is increased with increasing the probe current, it may be conceivable to mount the second condenser lens operating in real imaging mode behind the lower deflector 112 in accordance with the first condenser lens 11 operating in virtual imaging mode.

However, in the same way as for the first condenser lens 11, there is the problem that interference occurs between the focusing field produced by the second condenser lens and the deflecting field produced by the lower deflector 112. Therefore, a space must be secured to place the second condenser lens. Especially, in this case, the second condenser lens must be excited more strongly than the first condenser lens 11. Hence, the length of the instrument must be increased by an amount corresponding to the space for the second condenser lens.

If the electron detector is placed too close to the specimen, a separate general-purpose detector for detecting elastically scattered electrons and inelastically scattered electrons which are emitted at large angles cannot be placed. Therefore, little latitude is allowed in placing the electron detector. Elastically scattered electrons having small emission angles have small solid angles and contribute only a little to the overall signal. Therefore, if an image arising from electrons detected by the general-purpose detector can be derived at the same time, then increased convenience in use is provided with desirable results.

With respect to the diameters of apertures in the electron detectors, the electron beam is spread from tens of micrometers to hundreds of micrometers at the position of the electron detector. In contrast, the diameters of the apertures formed in the electron detector are on the order of micrometers in practice for the following reason. Assuming that the electron beam deviates from the optical axis 1a of the electron optical system by the effects of lens assembly error and external disturbances, the diameters of the apertures in the electron detectors are increased to grant some latitude.

The lower deflector 112 has a function of adjusting the axis of the electron beam relative to the objective lens 13 but cannot be used for adjusting the axial deviation of the electron beam from the electron detector 102 (aperture 102a). If an axial adjusting mechanism dedicated for the electron detector is added, it is cumbersome to adjust the instrument.

SUMMARY OF THE INVENTION

It is an object of the present invention to provide a scanning electron microscope in which a selected aperture through which an electron beam passes can be switched by electromagnetic deflection and, at the same time, the angular aperture of the electron beam can be controlled by improving the shapes of pole pieces included in first and second condenser lenses of the configuration shown in FIGS. 2A and 2B in such a way that a focusing field produced by the condenser lenses does not overlap with a deflecting field produced by deflectors (or deflecting means).

In this instrumentation, a scattering beam limiting aperture plate can be used in combination. Furthermore, the function of the scattering beam limiting aperture plate can be given to the electron detector. In consequence, elastically scattered electrons having smaller emission angles can be detected efficiently.

The difference between the present invention and the technique set forth in JP-A-2008-153158 is whether the focusing action of condenser lenses is used for sorting of electrons. In the present invention, elastically scattered electrons having small emission angles can be detected irrespective of the magnitude of the focusing action of condenser lenses. Furthermore, in the technique set forth in JP-A-2008-153158, energy selection is the main purpose. In the present invention, angular selection is the main purpose.

A scanning electron microscope based on the present invention is designed to produce an electron beam from an electron source, to focus the beam by an objective lens, to scan the beam over a specimen by means of scanning deflectors, and to detect electrons emanating from the specimen. The scanning electron microscope has a first condenser lens and a second condenser lens disposed between the electron source and the objective lens. The first condenser lens has a lens gap facing toward the electron source. The second condenser lens has a lens gap facing toward the objective lens. The first condenser lens is provided with a beam passage opening in which first deflecting means is disposed. The second condenser lens is provided with a beam passage opening in which second deflecting means is disposed. An aperture plate having a plurality of apertures of different diameters is mounted between the first and second deflecting means. An electron detector having a beam passage opening is mounted between the second deflecting means and the objective lens. The electron beam undergoing the lens action of the first condenser lens is deflected according to operation of the first deflecting means. Consequently, the beam passes through a selected one of the apertures in the aperture plate. The beam is then deflected according to operation of the second deflecting means and undergoes the lens action of the second condenser lens. Thus, the beam passes through the beam passage opening in the electron detector and reaches the specimen.

In the present invention, the lens gap of the first condenser lens faces toward the electron source. The lens gap of the second condenser lens faces toward the objective lens. The first and second deflecting means are disposed in the beam passage openings in the first and second condenser lenses, respectively. The aperture plate having the plural apertures of different diameters is mounted between the first and second deflecting means.

In this structure, the focusing field produced by the condenser lenses can be prevented from overlapping with the deflecting field produced by the deflecting means and, therefore, interference between the fields can be prevented. Consequently, the aperture in the aperture plate through which the electron beam passes can be switched well. Also, the angular aperture of the beam transmitted through this aperture can be controlled appropriately.

Additionally, the size of the instrument can be suppressed because the first and second deflecting means are disposed in the beam passage holes in the first and second condenser lenses, respectively.

DESCRIPTION OF THE INVENTION

Figure 1:
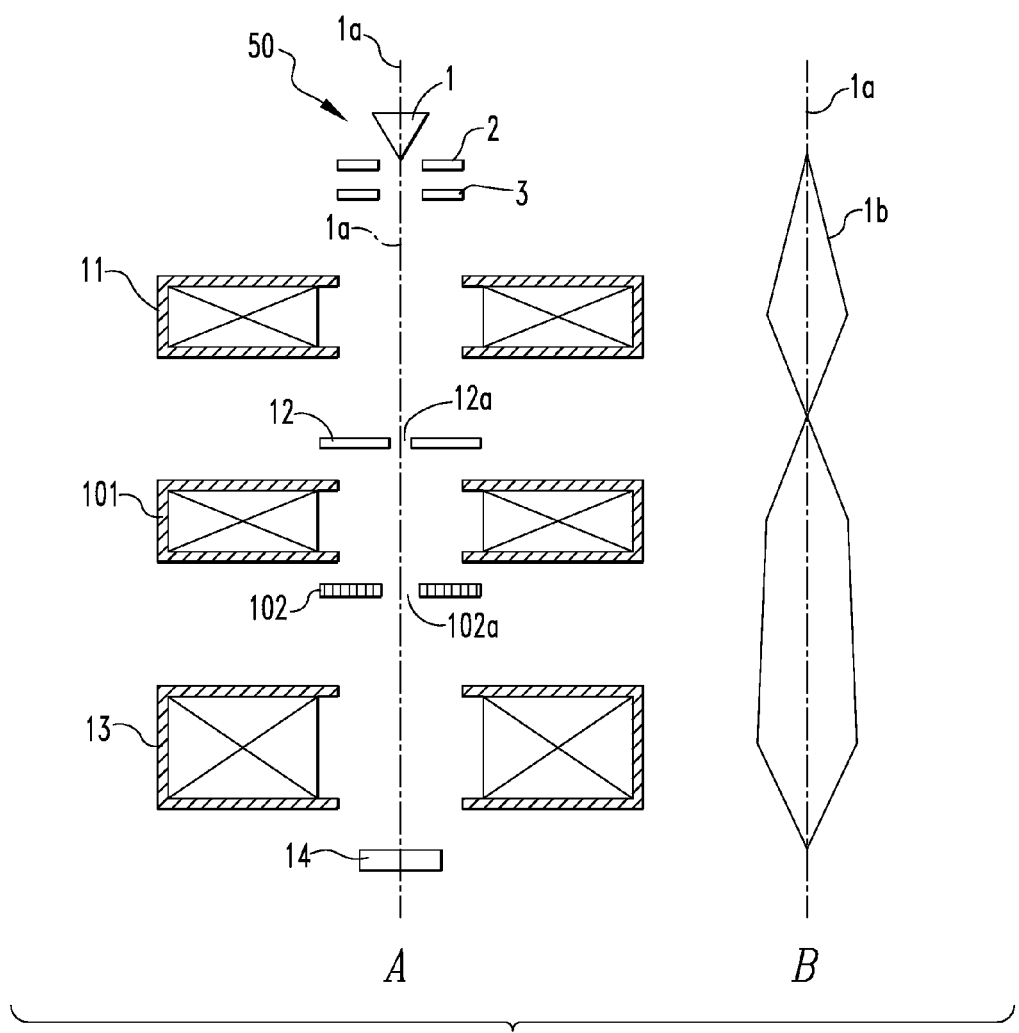
FIGS. 1A and 1B are schematic vertical cross sections of a conventional scanning electron microscope.
Figure 2:
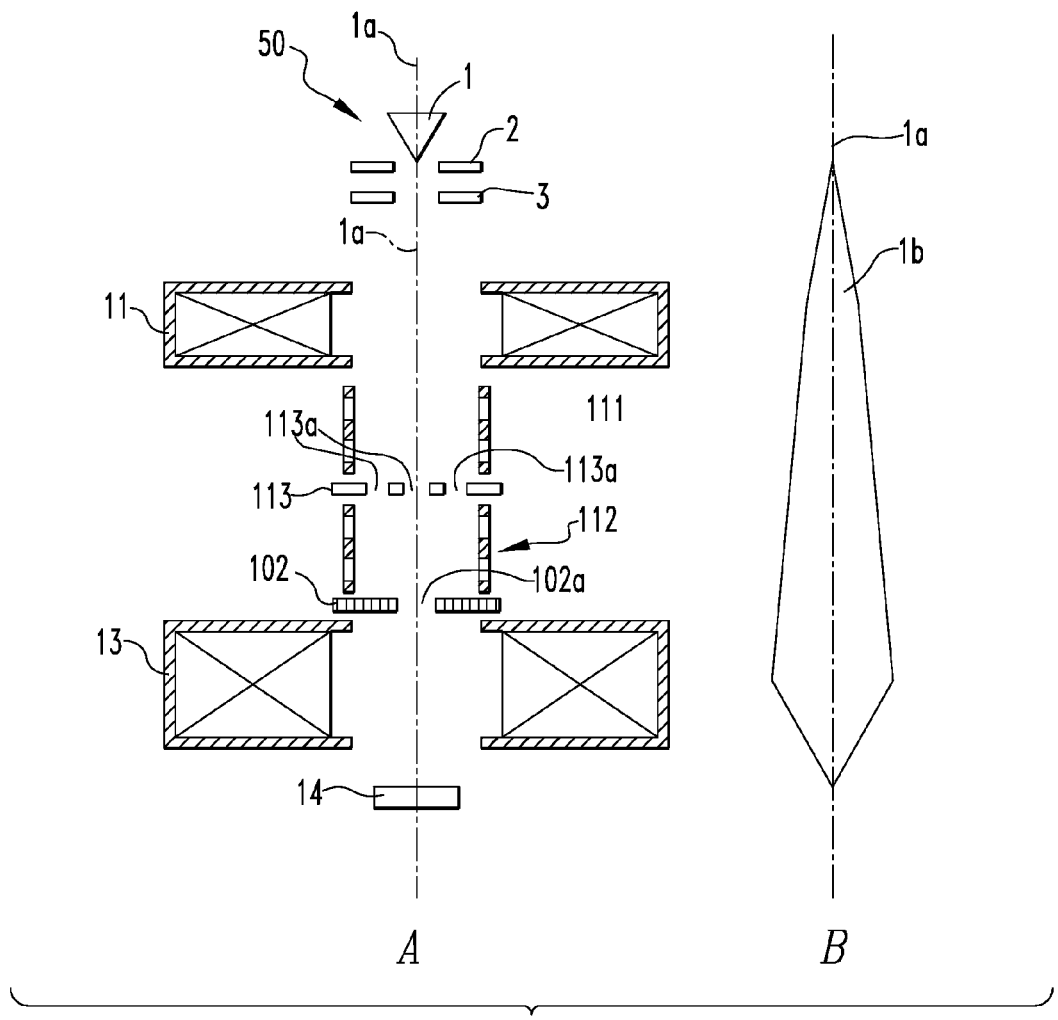
FIGS. 2A and 2B are schematic vertical cross sections of another conventional scanning electron microscope.
Figure 3:
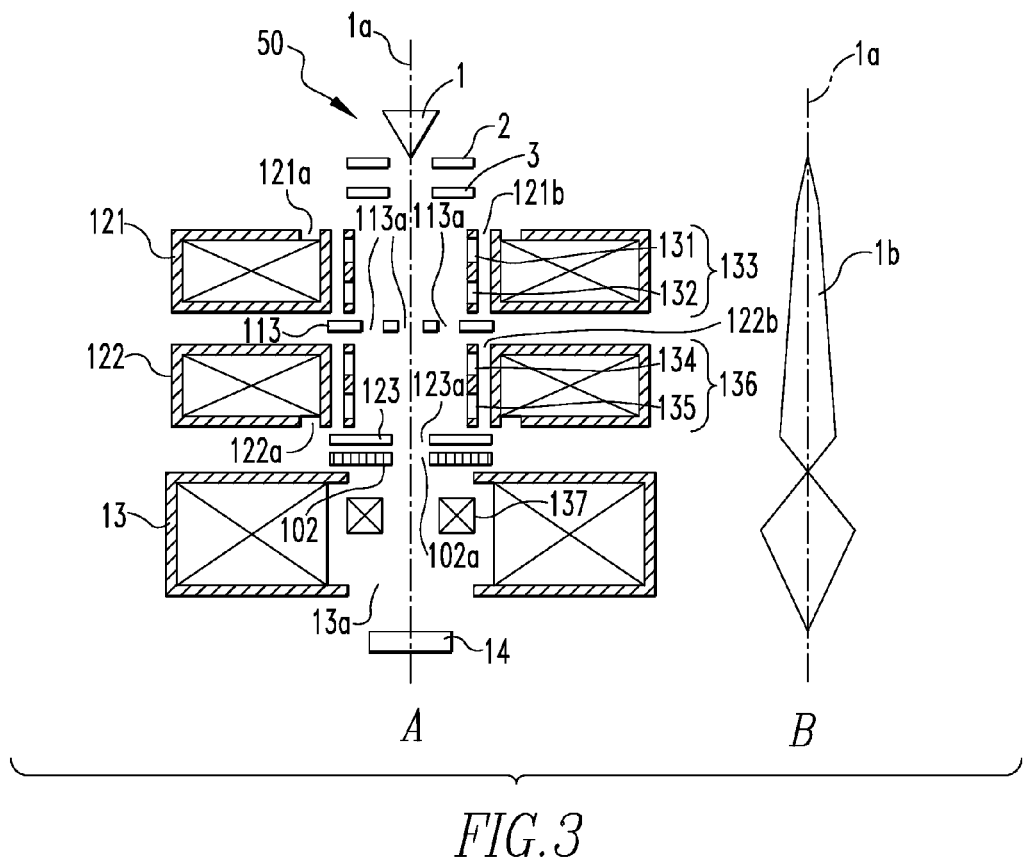
FIGS. 3A and 3B schematically show a scanning electron microscope according to a first embodiment of the present invention.

The present invention is hereinafter described in detail with reference to the drawings. FIGS. 3A and 3B schematically show a scanning electron microscope according to a first embodiment of the present invention. FIG. 3A shows the lens arrangement of this microscope. FIG. 3B shows the orbit of the electron beam in the lens arrangement. In FIGS. 2A, 2B, 3A, and 3B, like components are indicated by like reference numerals.

An electron gun 50 that is an electron source has an emitter 1, an extraction electrode 2, and acceleration electrodes 3. An extraction voltage is applied to the extraction electrode 2. As a result, electrons are extracted from the emitter 1 and accelerated by an acceleration voltage applied to the acceleration electrodes 3. Then, the electrons are released as an electron beam 1b toward a specimen 14.

A first condenser lens 121, a second condenser lens 122, and an objective lens 13 are disposed between the electron gun 50 and the specimen 14. The first condenser lens 121 is provided with a beam passage opening 121b in which an upper deflector (forming upper deflecting means) 133 is disposed. The upper deflector 133 consists of two stages of deflection coils, 131 and 132. The second condenser lens 122 is provided with a beam passage opening 122b in which a lower deflector (forming lower deflecting means) 136 is disposed. The lower deflector 136 consists of two stages of deflection coils, 134 and 135.

The objective aperture plate 113 is disposed between the upper deflector 133 and the lower deflector 136 and provided with a plurality of apertures 113a.

Figure 4:
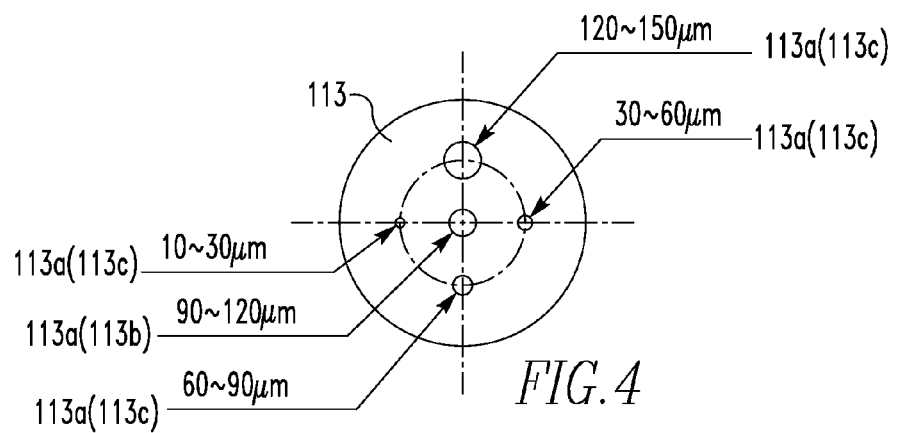
FIG. 4 is a plan view of the objective aperture plate included in the microscope shown in FIGS. 3A and 3B, showing the structure of the aperture plate.

FIG. 4 is a plan view of the objective aperture plate 113. This aperture plate 113 is centrally provided with an aperture 113b having a diameter of 90 to 120 μm. The center of the objective aperture plate 113 lies on the optical axis 1a of the electron optical system.

The objective aperture plate 113 is further provided with four apertures 113c which are located coaxially about the center position of the aperture plate 113 on the optical axis 1a of the electron optical system. These apertures 113c have different diameters of 10 to 30 μm, 30 to 60 μm, 60 to 90 μm, and 120 to 150 μm, respectively, as shown.

By providing the apertures of different diameters in this way, the probe current value of the electron beam 1b hitting the specimen 14 can be varied by switching the selected aperture between these four apertures.

A scattering beam limiting aperture plate 123 is disposed below the lower deflector 136 and located near the principal plane of the second condenser lens 122. The aperture plate 123 is centrally provided with an aperture 123a that is made to lie on the optical axis 1a of the electron optical system.

An electron detector 102 centrally provided with an aperture 102a is disposed below the scattering beam limiting aperture plate 123. The aperture 102a is also placed on the optical axis 1a of the electron optical system.

The objective lens 13 is located below the electron detector 102 and provided with a beam passage aperture 13a in which a scanning deflector 137 for scanning the electron beam 1b over the specimen 14 is disposed.

The first condenser lens 121 has pole pieces of a configuration modified from an ordinary lens configuration. The lens gap 121a of the first condenser lens 121 faces toward the electron gun 50.

Similarly, the second condenser lens 122 has poles pieces of a configuration modified from an ordinary lens configuration. The lens gap 122a of the second condenser lens 122 faces toward the objective lens 13.

Figure 5:
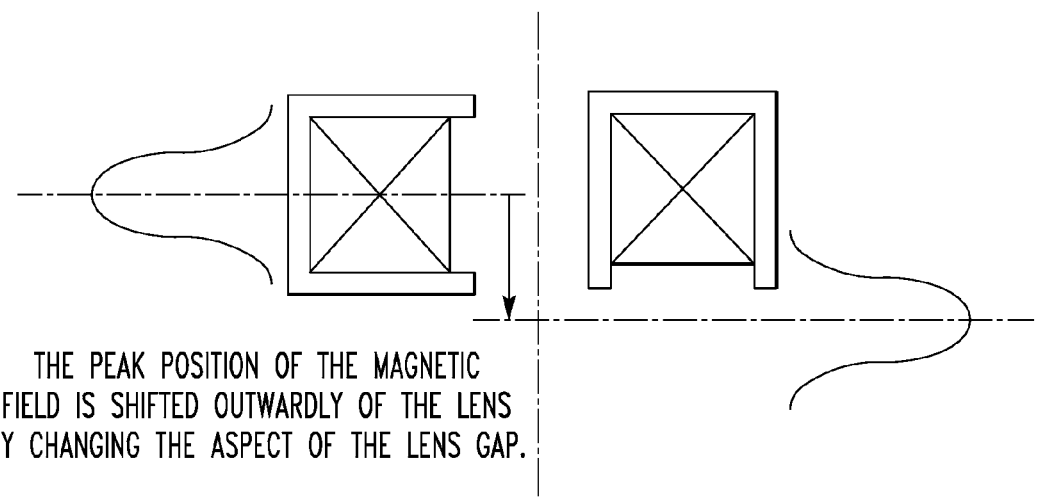
FIG. 5 shows the manner how a magnetic field produced by a condenser lens is varied by a variation in the geometry of the condenser lens.

Because of these modifications to the condenser lens shapes, the lens magnetic field varies as shown in FIG. 5, where a condenser lens having a modified shape is partially shown on the right side, while a condenser lens having an unmodified shape is partially shown on the left side. The peak position of the intensity of the magnetic field generated by the condenser lens of the modified shape (right side) is shifted outwardly (downward direction in the illustrated example) of the lens relative to the peak position of the intensity of the magnetic field generated by the condenser lens of the unmodified shape (left side). It is assumed that the lens of the modified construction shown on the right side has the configuration of the second condenser lens 122 of FIGS. 3A and 3B. In the case of the configuration of the first condenser lens 121, the lens configuration of the modified shape shown in FIG. 5 is turned upside down.

Figure 6:
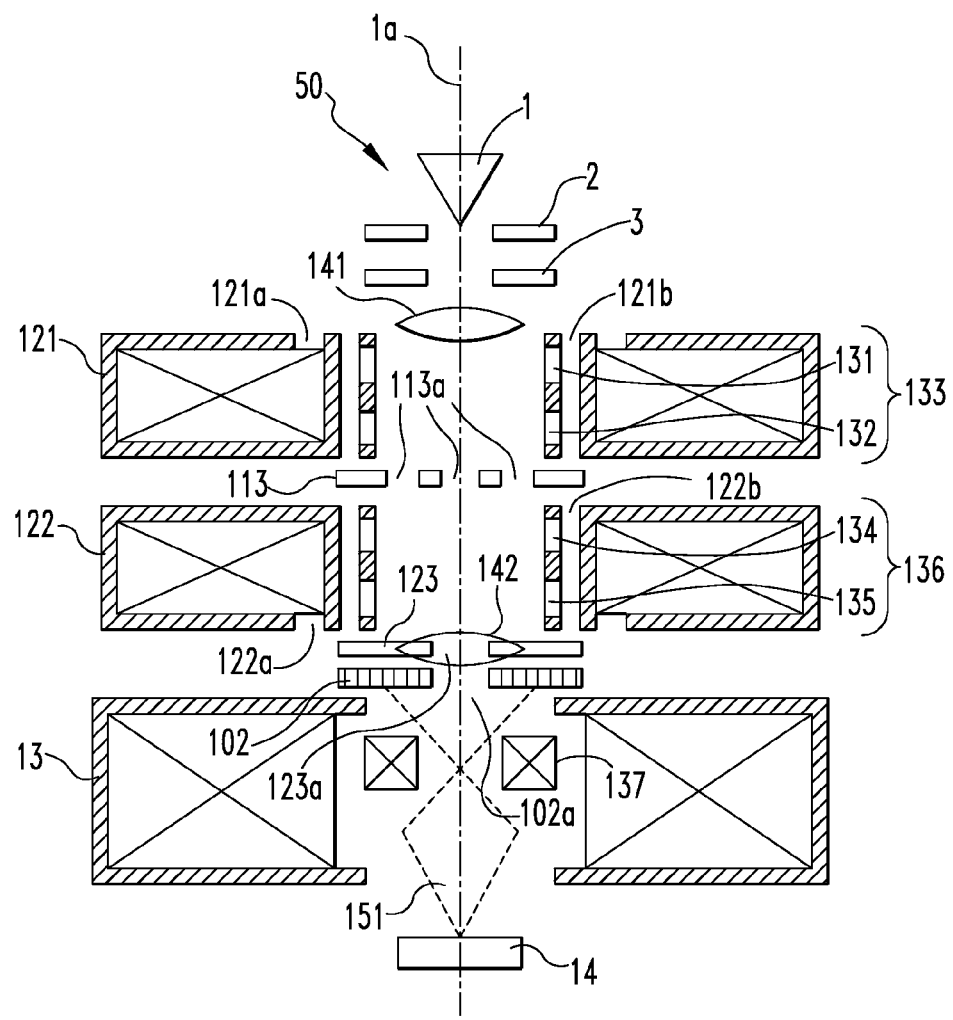
FIG. 6 is a vertical cross section, showing the position of a focusing field produced by first and second condenser lenses.

As a result, as shown in FIG. 6, a focusing field generated by the first condenser lens 121 assumes a position indicated by 141. A focusing field generated by the second condenser lens 122 assumes a position indicated by 142.

As a result, if the deflectors 133 and 136 are disposed in the beam passage openings 121b and 122b of the condenser lenses 121 and 122, respectively, the focusing fields can be sufficiently spaced from the deflecting fields produced by the deflectors 133 and 136, thus avoiding interference between the lens fields and the deflecting fields. The scattering beam limiting aperture plate 123 is close to the principal plane of the second condenser lens 122 that forms the focusing field as described previously.

The electron beam 1b emitted from the electron gun 50 is focused by the lens action (lens field 141) of the first condenser lens 121 and deflected from the optical axis 1a of the electron optical system by the deflecting action of the upper deflector 133. As a result, the beam 1b passes through the aperture 113a selected from the apertures in the objective aperture plate 113.

The electron beam 1b passed through this selected aperture 113a is deflected back to the optical axis 1a of the electron optical system by the deflecting action of the lower deflector 136 and focused further by the lens action (lens field 142) of the second condenser lens 122. The beam passes through the aperture 123a in the scattering beam limiting aperture plate 123 and through the aperture 102a in the electron detector 102.

Figure 7:
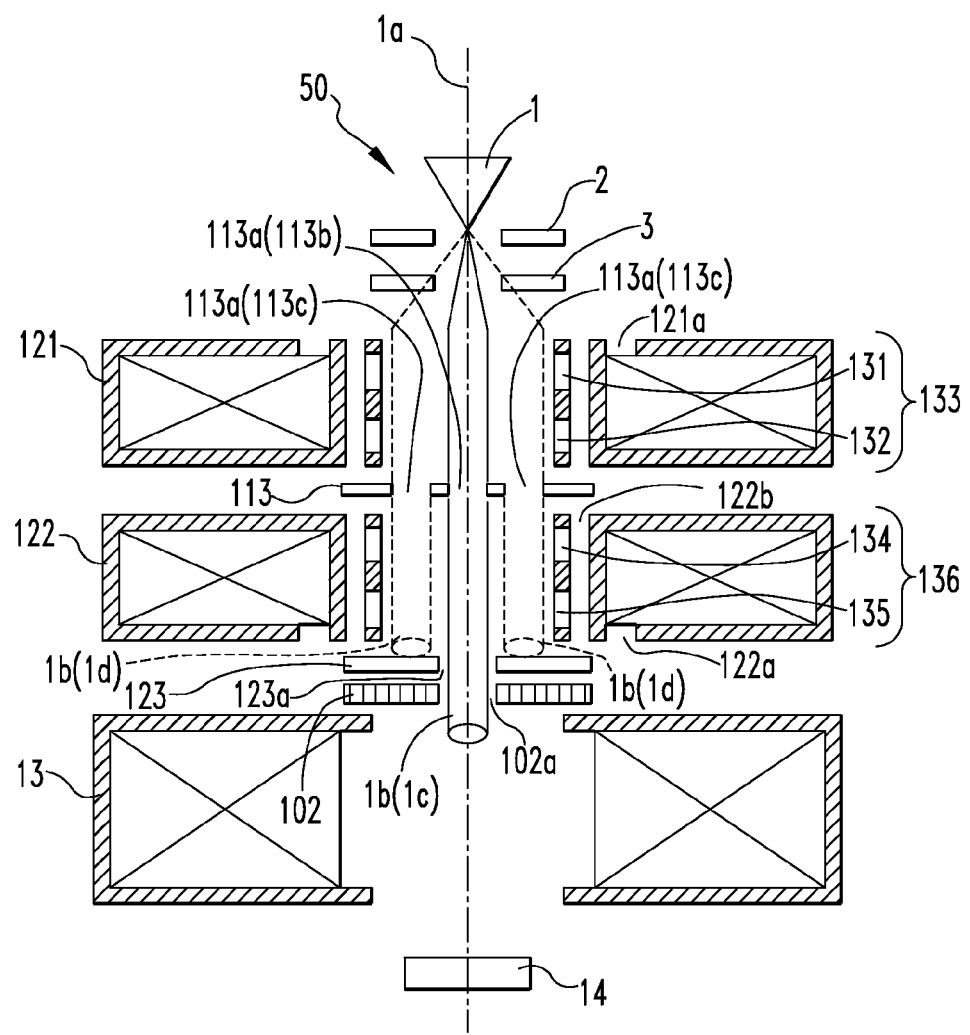
FIG. 7 is a vertical cross section, showing the orbit of an electron beam when the central aperture of the objective aperture plate has been selected.

The state in which the central aperture 113b has been selected from the apertures in the objective aperture plate 113 is shown in FIG. 7. Under this condition, most of the electron beam 1b released from the electron gun 50 passes through the central aperture 113b in the objective aperture plate 113.

The beam 1c passed through the central aperture 113b then passes through the aperture 123a in the scattering beam limiting aperture plate 123 and through the aperture 102a in the electron detector 102 and reaches the specimen 14. Parts 1d of the electron beam 1b passed through other aperture 113a in the objective aperture plate 113 are blocked out by the scattering beam limiting aperture plate 123.

Figure 8:
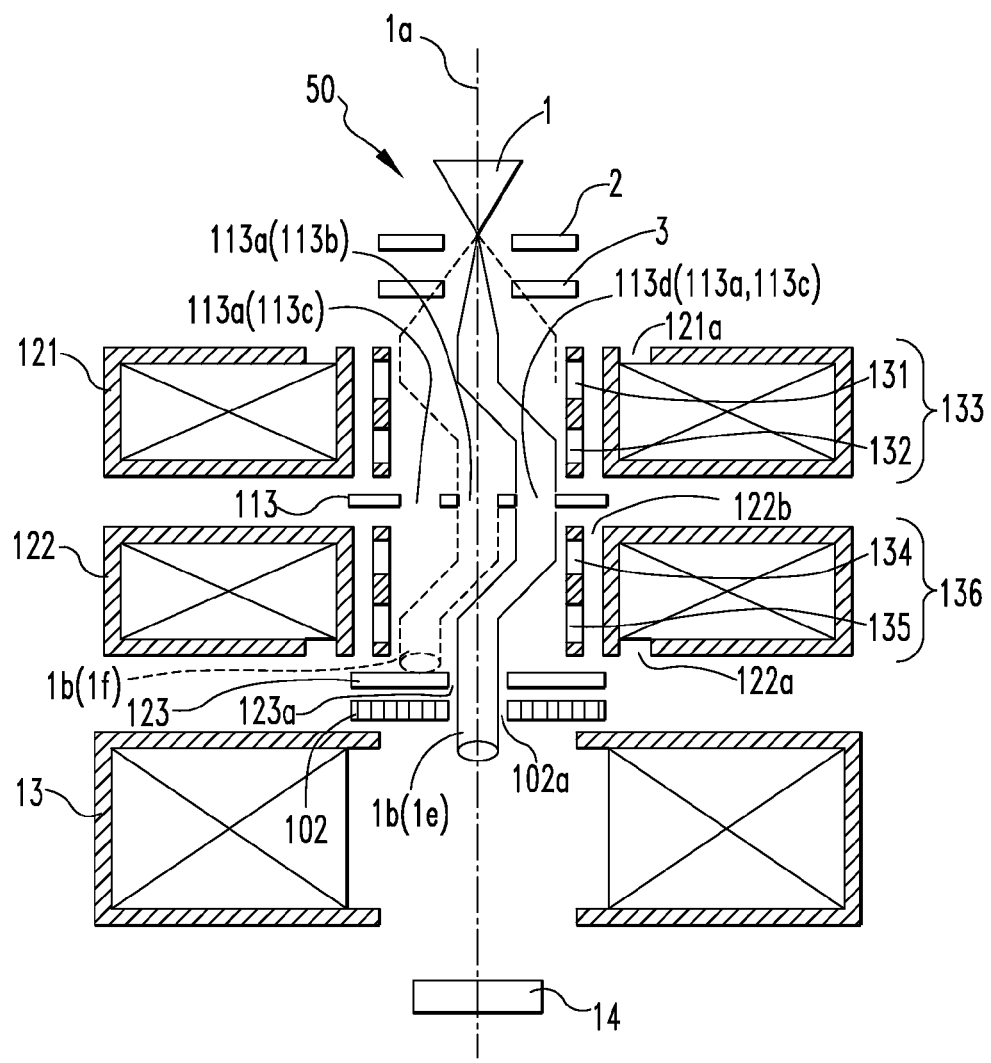
FIG. 8 is a vertical cross section similar to FIG. 7, but in which an aperture of the objective aperture plate other than the central aperture has been selected.

The state in which one aperture 113d out of the apertures 113c located coaxially about the center of the objective aperture plate 113 has been selected is shown in FIG. 8. At this time, most of the electron beam 1b released from the electron gun 50 passes through this aperture 113d of the objective aperture plate 113.

The electron beam 1e passed through the aperture 113d passes through the aperture 123a in the scattering beam limiting aperture plate 123 and through the aperture 102a in the electron detector 102 and reaches the specimen 14. A part 1f of the electron beam 1b passed through the other aperture 113a in the objective aperture plate 113 is blocked out by the scattering beam limiting aperture plate 123. In FIGS. 7 and 8, the scanning deflectors are omitted from being shown.

The operation of the scanning electron microscope constructed as described so far is next described. The electron beam 1b released from the electron gun 50 is focused by the first condenser lens as described previously and deflected by the upper deflector 133. As a result, the beam passes through the selected aperture 113a in the objective aperture plate 113.

At this time, the first condenser lens 121 is operated in the virtual imaging mode as shown in FIG. 3B. If the probe current value of the electron beam 1b hitting the specimen 14 is on the order of 10 nAm, the first condenser lens 121 can be operated even in the virtual imaging mode.

The electron beam 1b passed through the selected aperture 113a is deflected back by the deflecting action of the lower deflector 136 as described previously and focused by the second condenser lens. The beam then passes through the aperture 123a in the scattering beam limiting aperture plate 123 and through the aperture 102a in the electron detector 102. At this time, the second condenser lens 122 is operated in the real imaging mode.

The electron beam 1b passed through the electron detector 102 is focused as a primary electron beam onto the specimen 14 by the objective lens 13. At this time, the scanning deflector 137 scans the focused electron beam 1b over the specimen 14.

Electrons such as elastically scattered electrons and inelastically scattered electrons are produced from the specimen 14 scanned with the focused electron beam 1b. Of these electrons, elastically scattered electrons 151 having small emission angles are to be detected in the present invention. The electrons 151 ascend while being focused by the objective lens 13, and are detected by the electron detector 102. When the second condenser lens 122 operates in the real imaging mode, the detector detects electrons at a maximum efficiency.

A scanned image of the specimen 14 is created based on the output signal from the electron detector 102 and on the scanning signal for the focused electron beam 1b. The scanned image is displayed on a display device (not shown).

Figure 9:
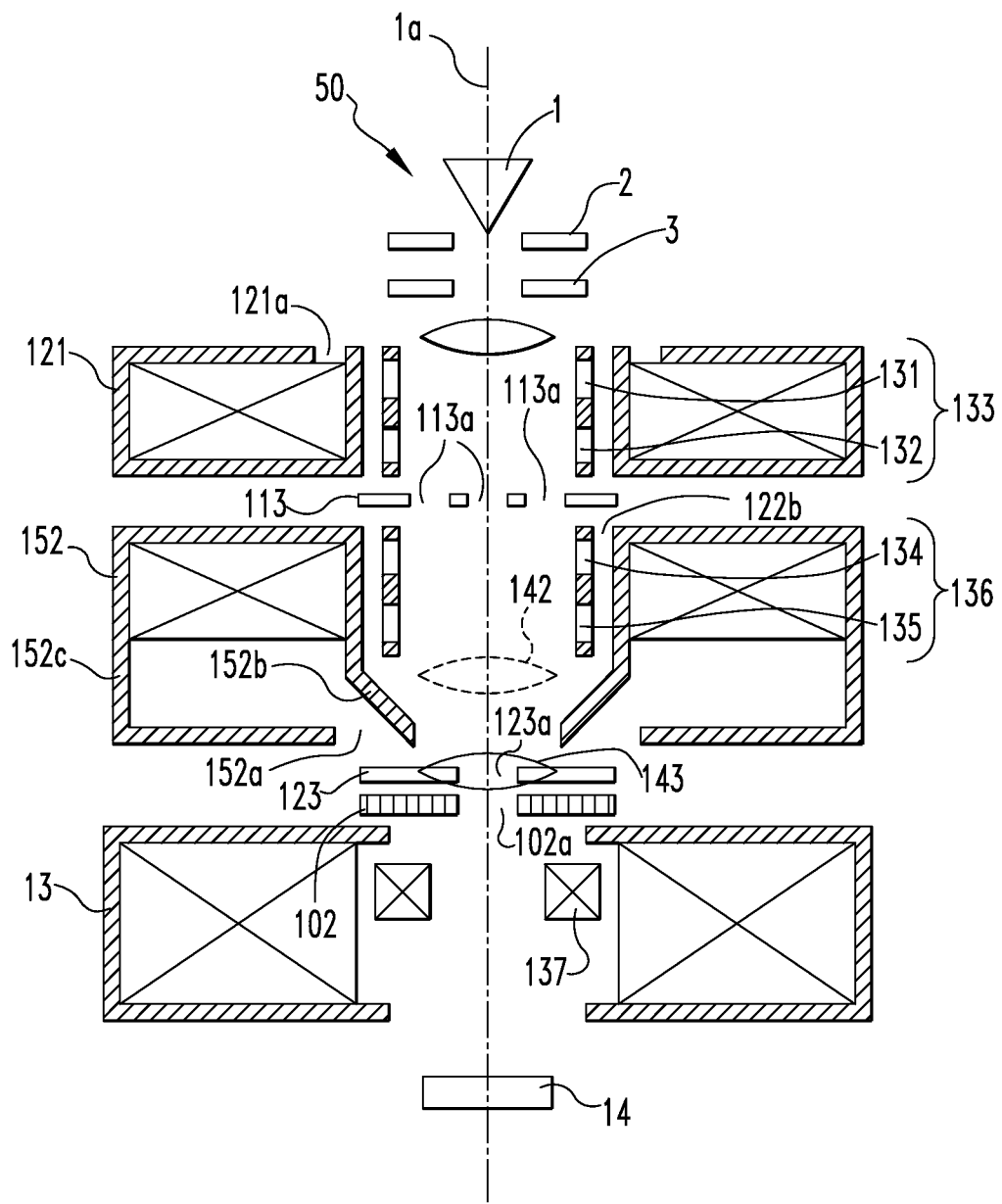
FIG. 9 is a schematic vertical cross section of a scanning electron microscope according to a modified embodiment of the invention.

As a modified embodiment, the shape of the second condenser lens can be further modified into the shape of the second condenser lens 152 shown in FIG. 9. The second condenser lens 152 has lower pole pieces 152b and 152c extended downward. As a result, the position of the lens gap 152a has shifted downward.

As a result, the position of the second condenser lens 152 is further shifted into a position 143 from the position 142 corresponding to the above-described embodiment. Consequently, it is possible to prevent, with greater certainty, the focusing field produced by the second condenser lens 152 from interfering with the deflecting field produced by the lower deflector 136. The second condenser lens 152 can be excited more strongly.

Figure 10:
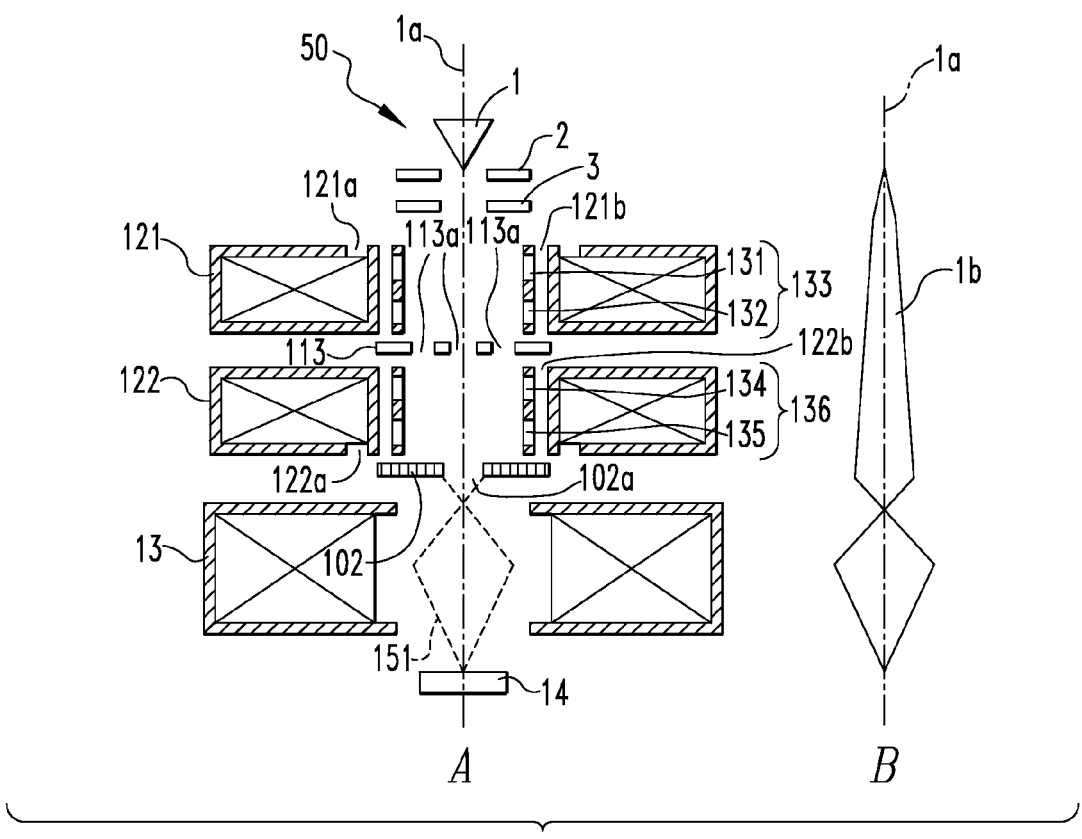
FIGS. 10A and 10B are schematic vertical cross sections of a scanning electron microscope according to another modified embodiment of the invention.

In the above embodiment and modified embodiment, the scattering beam limiting aperture plate 123 is mounted near the principal plane of the second condenser lens 122. In contrast, as shown in FIGS. 10A and 10B, the electron detector 102 can be placed near the principal plane of the second condenser lens 122 without mounting a scattering beam limiting aperture plate. In this case, the upper surface of the electron detector 102 that faces toward the electron gun 50 acts as a scattering beam limiting aperture plate. In FIGS. 10A and 10B, the scanning deflectors are omitted from being shown.

The position of the principal plane of the second condenser lens does not vary greatly irrespective of the extent to which the second condenser lens is excited. Therefore, as long as the second condenser lens is operating in the real imaging mode, elastically scattered electrons having small emission angles can be detected efficiently while these electrons are spread, if the electron detector 102 lies in this position.

Figure 11:
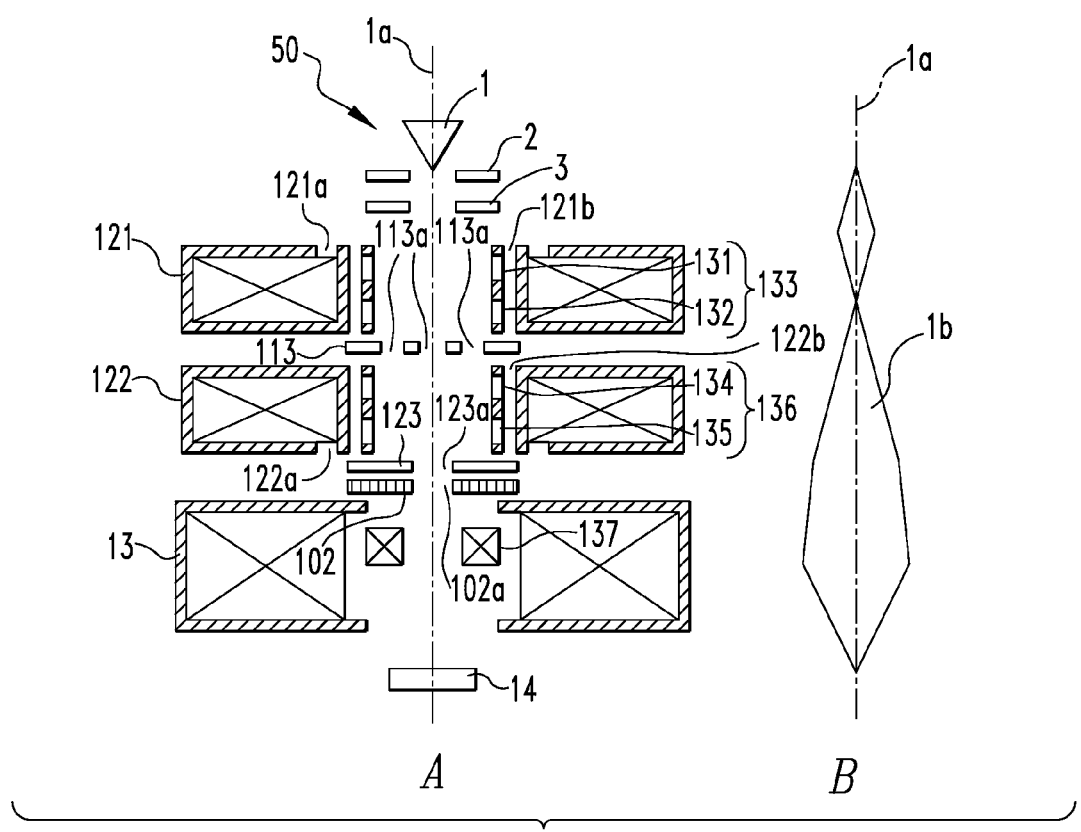
FIGS. 11A and 11B are vertical cross sections of a scanning electron microscope according to a second embodiment of the invention.

Furthermore, in the above embodiment and modified embodiment, the first condenser lens is operated in virtual imaging mode while the second condenser lens is operated in virtual imaging mode. As shown in FIGS. 11A and 11B, the first condenser lens can be operated in real imaging mode and the second condenser lens can be operated in virtual imaging mode. This constitutes a second embodiment of the present invention. In this embodiment, the apertures 113a in the objective aperture plate 113 are preferably arranged such that the angle of deflection made by each deflector is 25 mrad or less in order to obtain sufficiently high resolution when any aperture 113a in the objective aperture plate 113 is selected.

In the scanning electron microscope described so far, the electron beam 1b emitted from the electron source 50 is focused by the objective lens 13 and scanned over the specimen 14 by the scanning deflector 137. Electrons 151 emanating from the specimen 14 are detected. The first condenser lens 121 whose lens gap 121a faces toward the electron source 50 and the second condenser lens 122 (152) whose lens gap 122a (152a) faces toward the objective lens 13 are disposed between the electron source 50 and the objective lens 13. The first deflecting means 133 is disposed in the beam passage opening in the first condenser lens 121. The second deflecting means 136 is disposed in the beam passage opening in the second condenser lens 122 (152). The aperture plate 113 having the apertures 113a of different diameters is mounted between the first deflecting means 133 and the second deflecting means 136. The electron detector 102 having the beam passage aperture 102a is mounted between the second deflecting means 136 and the objective lens 13. The electron beam 1b undergoing the lens action of the first condenser lens 121 is deflected according to operation of the first deflecting means 133. Consequently, the beam 1b passes through the selected one of the apertures 113a of the aperture plate 113. The beam 1b passed through this aperture 113a is deflected according to operation of the second deflecting means 136 and undergoes the lens action of the second condenser lens 122 (152). As a consequence, the beam 1b passes through the beam passage aperture 102a in the electron detector 102 and reaches the specimen 14.

Each of the first deflecting means 133 and the second deflecting means 136 is composed of two stages of deflectors. The electron detector 102 can be placed near the principal plane of the second condenser lens 122 (152).

The limiting aperture plate 123 provided with the beam passage aperture 123a can be disposed between the second deflecting means 136 and the electron detector 102. In this configuration, the limiting aperture plate 123 can be placed near the principal plane of the second condenser lens 122 (152).

The lenses can be so controlled that the lens field produced by the first condenser lens 121 creates a virtual image from the electron beam 1b and that the lens field generated by the second condenser lens 122 (152) creates a real image from the electron beam 1b.

The lenses can also be so controlled that the lens field produced by the first condenser lens 121 forms a real image from the first electron beam 1b and that the lens field produced by the second condenser lens 122 (152) forms a virtual image from the electron beam 1b.

In the present embodiment of the present invention, in the electron optical system where the first condenser lens 121 and the second condenser lens 122 (152) are combined with the deflecting means 133, 136, it is possible to prevent the focusing fields from overlapping with the deflecting fields while keeping the instrument compact by making the lens gap 121a of the first condenser lens 121 face toward the electron source 50 and the lens gap 122a (152a) of the second condenser lens 122 (152) face toward the objective lens 13.

Where the scattering beam limiting aperture plate 123 does not exist, it has been necessary to place the objective aperture plate 113 close to the electron source 50. More latitude is allowed in placing the objective aperture plate 113 by placing the scattering beam limiting aperture plate 123. In this case, the scattering beam limiting aperture plate can be used in place of the electron detector 102.

By placing the electron detector 102 near the principal plane of the second condenser lens 122 (152), inelastically scattered electrons having small emission angles can be detected while these electrons are spread. Consequently, these electrons can be detected efficiently.

Having thus described my invention with the detail and particularity required by the Patent Laws, what is desired protected by Letters Patent is set forth in the following claims.

The invention claimed is:

1. A scanning electron microscope for producing an electron beam from an electron source, focusing the beam by an objective lens, scanning the beam over a specimen by means of scanning deflectors, and detecting electrons emanating from the specimen, said scanning electron microscope comprising:
    a first condenser lens having a lens gap facing toward the electron source;
    a second condenser lens having a lens gap facing toward the objective lens, the first condenser lens and the second condenser lens being disposed between the electron source and the objective lens;
    first deflecting means disposed in a beam passage opening formed in the first condenser lens;
    second deflecting means disposed in a beam passage opening formed in the second condenser lens;
    an aperture plate having a plurality of apertures of different diameters and mounted between the first deflecting means and the second deflecting means; and
    an electron detector having a beam passage opening and mounted between the second deflecting means and the objective lens,
    wherein the electron beam undergoes a lens action of the first condenser lens and is deflected according to operation of the first deflecting means to cause the electron beam to pass through a selected one of the apertures in the aperture plate; and
    wherein the electron beam passed through the selected aperture is deflected according to operation of the second deflecting means and undergoes a lens action of the second condenser lens such that the electron beam passes through the beam passage opening in the electron detector and reaches the specimen.

2. The scanning electron microscope as set forth in claim 1, wherein each of said first deflecting means and said second deflecting means is made up of two stages of deflectors.

3. The scanning electron microscope as set forth in claim 2, wherein said electron detector is placed near a principal plane of said second condenser lens.

4. The scanning electron microscope as set forth in claim 3, wherein a limiting aperture plate provided with a beam passage aperture is mounted between said second deflecting means and said electron detector.

5. The scanning electron microscope as set forth in claim 4, wherein said limiting aperture plate is disposed near a principal plane of said second condenser lens.

6. The scanning electron microscope as set forth in claim 1, wherein a lens field produced by said first condenser lens forms a virtual image from the electron beam, and wherein a lens field produced by said second condenser lens forms a real image from the electron beam.

7. The scanning electron microscope as set forth in claim 1, wherein a lens field produced by said first condenser lens forms a real image from the electron beam, and wherein a lens field produced by said second condenser lens forms a virtual image from the electron beam.

* * * * *